United States Patent
Tochigi et al.

(10) Patent No.: US 10,373,990 B2
(45) Date of Patent: Aug. 6, 2019

(54) SOLID-STATE IMAGING ELEMENT AND ELECTRONIC APPARATUS WITH UNIT PIXEL REGIONS, A READOUT CIRCUIT FOR EACH OF THE UNIT PIXEL REGIONS, AND A COMPENSATION UNIT

(71) Applicant: SONY SEMICONDUCTOR SOLUTIONS CORPORATION, Kanagawa (JP)

(72) Inventors: Yasuhisa Tochigi, Kanagawa (JP); Masaki Sakakibara, Kanagawa (JP); Tadayuki Taura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/753,100

(22) PCT Filed: Aug. 12, 2016

(86) PCT No.: PCT/JP2016/073712
§ 371 (c)(1),
(2) Date: Feb. 15, 2018

(87) PCT Pub. No.: WO2017/038428
PCT Pub. Date: Mar. 9, 2017

(65) Prior Publication Data
US 2018/0240823 A1    Aug. 23, 2018

(30) Foreign Application Priority Data
Aug. 28, 2015 (JP) ................. 2015-168642

(51) Int. Cl.
*H04N 5/341* (2011.01)
*H04N 5/357* (2011.01)
(Continued)

(52) U.S. Cl.
CPC ...... *H01L 27/146* (2013.01); *H01L 27/14603* (2013.01); *H01L 27/14609* (2013.01);
(Continued)

(58) Field of Classification Search
CPC ....... H01L 27/146; H01L 27/14; H04N 5/376; H04N 5/374; H04N 5/369; H04N 5/341; H04N 5/357
See application file for complete search history.

(56) References Cited

U.S. PATENT DOCUMENTS

| 2005/0052940 A1* | 3/2005 | Koizumi | H04N 5/378 365/232 |
| 2008/0024631 A1* | 1/2008 | Tani | H04N 5/23254 348/264 |
| 2016/0211299 A1* | 7/2016 | Arita | H04N 5/374 |

FOREIGN PATENT DOCUMENTS

| JP | 2013-090238 | 5/2013 |
| JP | 2014-179893 | 9/2014 |

(Continued)

OTHER PUBLICATIONS

International Search Report prepared by the Japan Patent Office dated Oct. 4, 2016, for International Application No. PCT/JP2016/073712.

*Primary Examiner* — Allen L Parker
*Assistant Examiner* — Gustavo G Ramallo
(74) *Attorney, Agent, or Firm* — Sheridan Ross P.C.

(57) ABSTRACT

The present disclosure relates to a solid-state imaging element and an electronic apparatus, in which the number of wires controlling readout can be reduced in a case where a pixel signal of each pixel is read out in a predetermined order for each unit pixel region. The unit pixel region is configured by a plurality of pixels arranged in an array. A readout circuit is provided for each unit pixel region and reads out, in a predetermined order, pixel signals of the (Continued)

plurality of pixels configuring the unit pixel regions. Pixel drive wires, which control readout of the pixels configuring the unit pixel regions adjacent in the vertical direction and having the same readout order, are shared. The present disclosure can be applied to, for example, a CMOS image sensor and the like.

16 Claims, 13 Drawing Sheets

(51) Int. Cl.
  *H01L 27/146* (2006.01)
  *H04N 5/369* (2011.01)
  *H04N 5/374* (2011.01)
  *H04N 5/376* (2011.01)

(52) U.S. Cl.
  CPC ............ *H04N 5/341* (2013.01); *H04N 5/357* (2013.01); *H04N 5/369* (2013.01); *H04N 5/374* (2013.01); *H04N 5/376* (2013.01)

(56) References Cited

FOREIGN PATENT DOCUMENTS

| | | |
|---|---|---|
| JP | 2015-070591 | 4/2015 |
| JP | 2015-144340 | 8/2015 |

* cited by examiner

SOLID-STATE IMAGING ELEMENT AND ELECTRONIC APPARATUS WITH UNIT PIXEL REGIONS, A READOUT CIRCUIT FOR EACH OF THE UNIT PIXEL REGIONS, AND A COMPENSATION UNIT

CROSS REFERENCE TO RELATED APPLICATIONS

This application is a national stage application under 35 U.S.C. 371 and claims the benefit of PCT Application No. PCT/JP2016/073712 having an international filing date of 12 Aug. 2016, which designated the United States, which PCT application claimed the benefit of Japan Patent Application No. 2015-168642 filed 28 Aug. 2015, the disclosures of each of which are incorporated herein by reference.

TECHNICAL FIELD

The present disclosure relates to a solid-state imaging element and an electronic apparatus, and, in particular, relates to a solid-state imaging element and an electronic apparatus, in which the number of wires which control readout can be reduced in a case where a pixel signal of each pixel is read out in a predetermined order for each unit pixel region.

BACKGROUND ART

In recent years, there is an imaging element in which a backside illumination type imaging chip and a signal processing chip are laminated. In such an imaging element, it has been suggested that pixels arranged in an array formed on a backside illumination type imaging chip are divided into unit pixel regions constituted by a plurality of pixels, and a pixel signal of each pixel is read out in a predetermined order for each unit pixel region (e.g., see Patent Document 1).

In the invention of Patent Document 1, the readout of the pixel signal is controlled such that positions of pixels having the same readout order of the pixel signals within adjacent unit pixel regions become line-symmetric with respect to the boundary of the unit pixel regions, thereby suppressing image distortion at the boundary of the unit pixel regions.

CITATION LIST

Patent Document

Patent Document 1: Japanese Patent Application Laid-Open No. 2014-179893

SUMMARY OF THE INVENTION

Problems to be Solved by the Invention

Incidentally, in the invention of Patent Document 1, a wire (hereinafter, referred to as a pixel drive wire) which controls readout of a pixel signal is provided for each pixel in the unit pixel regions. Accordingly, in a case where the unit pixel region is configured by pixels of horizontal (H)×Vertical (V) (H and V are natural numbers), the number of pixel drive wires necessary for one unit pixel region is H×V, and the number of the pixel drive wires formed for each row of the pixels is H. Therefore, as the number of pixels within the unit pixel region increases, the number of pixel drive wires increases.

The present disclosure has been made in light of the above circumstances and can reduce the number of wires which control readout in a case where a pixel signal of each pixel is read out in a predetermined order for each unit pixel region.

Solutions to Problems

A solid-state imaging element according to a first aspect of the present disclosure includes: unit pixel regions which are arranged in an array and configured by a plurality of pixels; and a readout circuit which is provided for each of the unit pixel regions and reads out, in a predetermined order, pixel signals of the plurality of pixels configuring the unit pixel regions, in which wires, which control readout of the pixels which configure the unit pixel regions adjacent in a predetermined direction and have the same readout order, are configured to be shared.

According to the first aspect of the present disclosure, unit pixel regions which are arranged in an array and configured by a plurality of pixels, and a readout circuit which is provided for each of the unit pixel regions and reads out, in a predetermined order, pixel signals of the plurality of pixels configuring the unit pixel regions are provided, and wires, which control readout of the pixels which configure the unit pixel regions adjacent in a predetermined direction and have the same readout order, are shared.

An electronic apparatus according to a second aspect of the present disclosure includes: a solid-state imaging element including: unit pixel regions which are arranged in an array and configured by a plurality of pixels; and a readout circuit which is provided for each of the unit pixel regions and reads out, in a predetermined order, pixel signals of the plurality of pixels configuring the unit pixel regions, in which wires, which control readout of the pixels which configure the unit pixel regions adjacent in a predetermined direction and have the same readout order, are configured to be shared.

According to the second aspect of the present disclosure, unit pixel regions which are arranged in an array and configured by a plurality of pixels, and a readout circuit which is provided for each of the unit pixel regions and reads out, in a predetermined order, pixel signals of the plurality of pixels configuring the unit pixel regions are provided, and wires, which control readout of the pixels which configure the unit pixel regions adjacent in a predetermined direction and have the same readout order, are shared.

Effects of the Invention

According to the first and second aspects of the present disclosure, imaging can be performed. Moreover, according to the first aspect of the present disclosure, the number of wires which control the readout can be reduced in a case where a pixel signal of each pixel is read out in a predetermined order for each unit pixel region.

Note that the effects described herein are not necessarily limited, and any one of the effects described in the present disclosure may be applied.

MODE FOR CARRYING OUT THE INVENTION

Hereinafter, modes for carrying out the present disclosure (hereinafter, referred to as embodiments) will be described. Note that the description will be given in the following order.

1. First Embodiment: CMOS image Sensor (FIGS. 1 to 12)
2. Second Embodiment: Imaging Device (FIG. 13)
3. Usage Example of CMOS Image Sensor (FIG. 14)

First Embodiment (Configuration Example of One Embodiment of CMOS Image Sensor)

Figure 1:
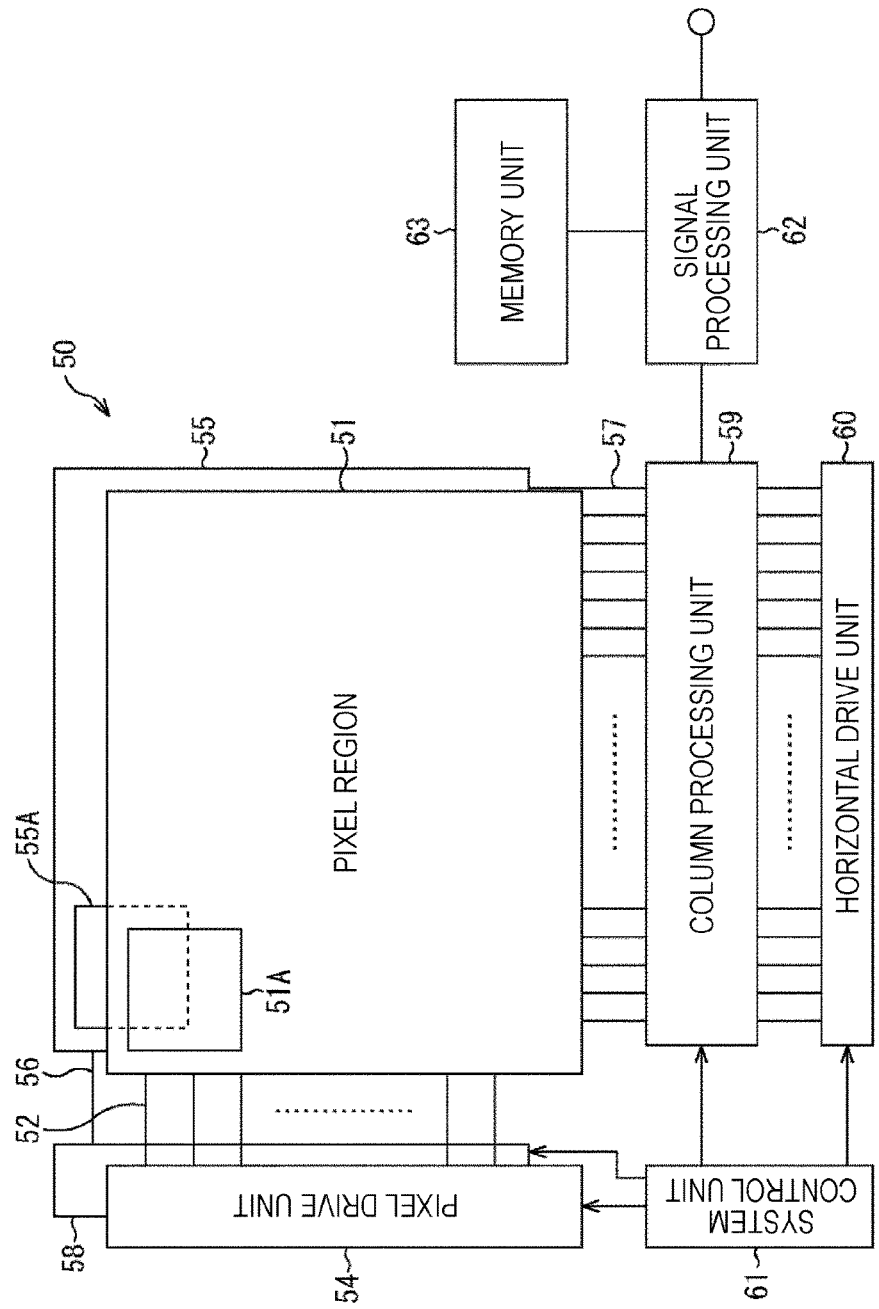
FIG. 1 is a diagram showing a configuration example of one embodiment of a CMOS image sensor as a solid-state imaging element to which the present disclosure is applied.

FIG. 1 is a diagram showing a configuration example of one embodiment of a CMOS image sensor as a solid-state imaging element to which the present disclosure is applied.

A CMOS image sensor 50 includes a pixel region 51, pixel drive wires 52, a pixel drive unit 54, a readout region 55, readout drive wires 56, vertical signal wires 57, a readout circuit drive unit 58, a column processing unit 59, a horizontal drive unit 60, a system control unit 61, a signal processing unit 62 and a memory unit 63, which are formed on a semiconductor substrate (chip) such as a silicon substrate (not shown).

In the pixel region 51 of the CMOS image sensor 50, a plurality of pixels, each having a photoelectric conversion element which generates an electric charge of an electric charge amount corresponding to a light amount of incident light and accumulates the electric charge therein, are two-dimensionally arranged in an array. The pixels arranged in the pixel region 51 are divided into unit pixel regions 51A for each of the plurality of pixels. That is, the pixel region 51 is configured by the unit pixel regions 51A which are arranged in an array and configured by the plurality of pixels. For each pixel, a readout order of that pixel signal of a pixel is set such that the pixel signal corresponding to the electric charge accumulated in the photoelectric conversion element of each pixel within the unit pixel regions 51A is read out in a predetermined order for each unit pixel region 51A including that pixel.

In the pixel region 51, the pixel drive wires 52 are formed for each two rows of the pixels by only the number of pixels (the number of columns) in the horizontal direction within the unit pixel regions 51A. The pixel drive wires 52 are connected to each pixel having the same readout order among the pixels of the corresponding two rows and controls the readout of the pixel signals.

The pixel drive unit 54 is configured by a shift register, an address decoder and the like. The pixel drive unit 54 supplies signals according to a readout order to the pixel drive wires 52 connected to the pixels with that readout order. Thus, the pixel signals of the pixels within each unit pixel region 51A are read out simultaneously with the pixel signals of the pixels within other unit pixel regions 51A, to which the same readout order is set, in the readout order set for those pixels. The read out pixel signals are outputted to readout circuits 55A of the unit pixel regions 51A for those pixel signals in the readout region 55.

In the readout region 55, the readout circuit 55A of each unit pixel region 51A is two-dimensionally arranged in an array. The readout circuit 55A performs signal processing such as A/D conversion processing, correlated double sampling (CDS) processing and the like on the pixel signals outputted from the pixels within the corresponding unit pixel region 51A and temporarily keeps the signals. Moreover, in the readout region 55, the readout drive wires 56 are formed for each row and the vertical signal wires 57 are formed for each column in the arrayed readout circuits 55A.

The readout circuit drive unit 58 is configured by a shift register, an address decoder and the like and drives each readout circuit 55A in the readout region 55 by the unit of row or the like. Specifically, the readout circuit drive unit 58 sequentially selects each row and outputs a selection signal to the readout drive wire 56 of the selected row. Thus, the pixel signals after the signal processing kept in each readout circuit 55A of the selected row are read out and supplied to the vertical signal wires 57.

The column processing unit 59 has a signal processing circuit for each column of the readout circuits 55A. Each signal processing circuit of the column processing unit 59 temporarily keeps the pixel signals outputted from each readout circuit 55A of the selected row through the vertical signal wires 57.

The horizontal drive unit 60 is configured by a shift register, an address decoder and the like and selects the signal processing circuits of the column processing unit 59 in order. With this selective scanning by the horizontal drive unit 60, the pixel signals kept in each signal processing circuit of the column processing unit 59 are outputted to the signal processing unit 62 in order.

The system control unit 61 is configured by a timing generator which generates various timing signals, and the like, and controls the pixel drive unit 54, the readout circuit drive unit 58, the column processing unit 59 and the horizontal drive unit 60 on the basis of the various timing signals generated by the timing generator.

The signal processing unit 62 stores, as an image in the unit of frame, the pixel signals outputted from the column processing unit 59 in the memory unit 63. The signal processing unit 62 determines whether or not the pixel signal of each pixel of the image stored in the memory unit 63 is equal to or greater than a predetermined threshold value.

In a case where the ratio of the pixels whose pixel signals for all the pixels in a predetermined region within the pixel region 51 are equal to or greater than the predetermined threshold value is equal to or greater than a threshold value, the signal processing unit 62 compensates the pixel signals, which are equal to or greater than the predetermined threshold value, by using the pixel signals stored in the memory unit 63. The signal processing unit 62 outputs an image in which the pixel signals equal to or greater than the predetermined threshold value are compensated. On the other hand, in a case where the ratio of the pixels whose pixel signals for all the pixels in the predetermined region within the pixel region 51 are equal to or greater than the predetermined threshold value is less than the threshold value, the signal processing unit 62 directly outputs the image stored in the memory unit 63.

The memory unit 63 is constituted by dynamic random access memory (DRAM), static random access memory (SRAM), or the like.

(First Configuration Example of Pixel Region)

Figure 2:
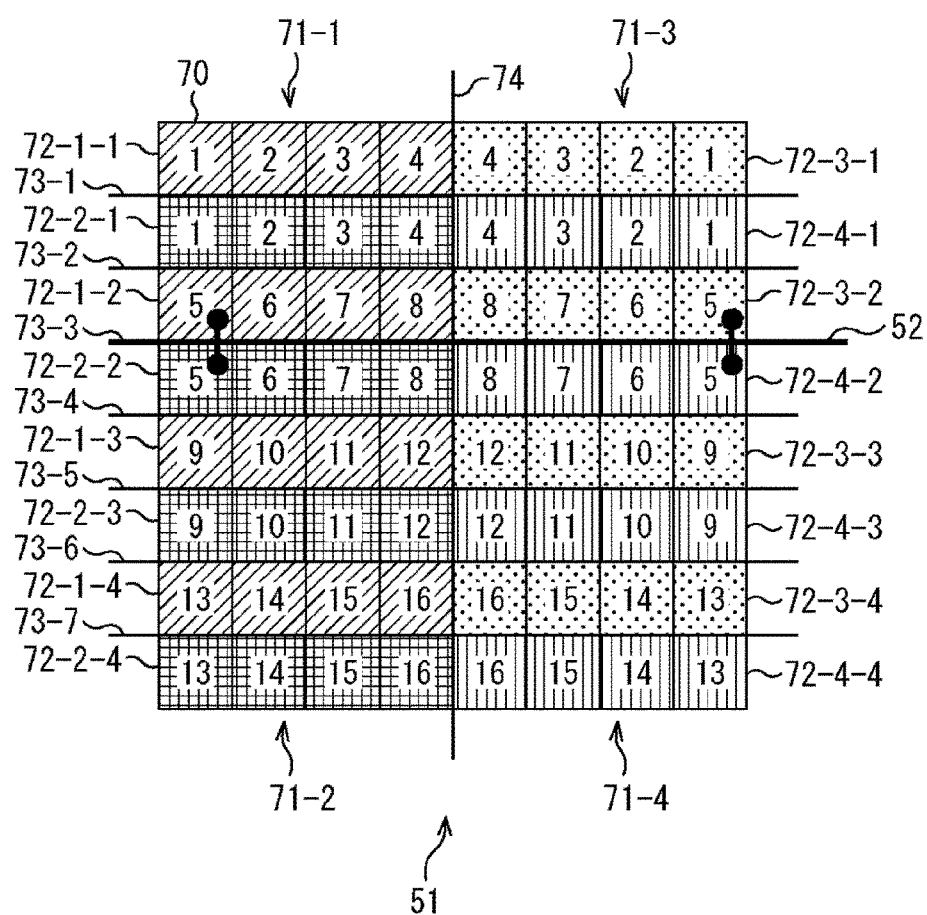
FIG. 2 is a diagram showing a first configuration example of the pixel region in FIG. 1.

FIG. 2 is a diagram showing a first configuration example of the pixel region 51 in FIG. 1.

Note that, in FIG. 2, a square represents a pixel 70, and a number within the square represents the readout order set for that pixel 70. Moreover, squares representing the pixels 70 within the same unit pixel regions 51A are given the same hatches. The same also applies to FIGS. 3 to 7 described later.

In the example in FIG. 2, unit pixel region 71-1 to 71-4, which are the 2 (horizontal)×2 (vertical) unit pixel regions 51A, are arranged in the pixel region 51. The unit pixel region 71-1 is configured by pixel groups 72-1-1 to 72-1-4 constituted by 4×1 pixels 70. That is, the unit pixel region 71-1 is configured by 4×4 pixels 70.

Similarly to the unit pixel region 71-1, the unit pixel regions 71-2 to 71-4 are also configured by pixel groups 72-2-1 to 72-2-4, pixel groups 72-3-1 to 72-3-4 and pixel groups 72-4-1 to 72-4-4, respectively. Each pixel group is constituted by 4×1 pixels 70.

Note that, in a case where it is not necessary to particularly distinguish the unit pixel regions 71-1 to 71-4, they are collectively referred to as a unit pixel region 71 hereinafter. Similarly, the pixel groups 72-1-1 to 72-1-4, the pixel groups 72-2-1 to 72-2-4, the pixel groups 72-3-1 to 72-3-4 and the pixel groups 72-4-1 to 72-4-4 are collectively referred to as a pixel group 72.

Each pixel group 72 configuring the unit pixel region 71 adjacent in the vertical direction is alternately arranged in the vertical direction. Specifically, the pixel groups 72-1-1 to 72-1-4 of the unit pixel region 71-1 and the pixel groups 72-2-1 to 72-2-4 of the unit pixel region 71-2, in which the unit pixel regions 71-1 and 71-2 are adjacent in the vertical direction, are arranged, in order from the top, the pixel group 72-1-1, the pixel group 72-2-1, the pixel group 72-1-2, the pixel group 72-2-2, the pixel group 72-1-3, the pixel group 72-2-3, the pixel group 72-1-4 and the pixel group 72-2-4.

Moreover, the pixel groups 72-3-1 to 72-3-4 of the unit pixel region 71-3 and the pixel groups 72-4-1 to 72-4-4 of the unit pixel region 71-4, in which the unit pixel regions 71-3 and 71-4 are adjacent in the vertical direction, are arranged, in order from the top, the pixel group 72-3-1, the pixel group 72-4-1, the pixel group 72-3-2, the pixel group 72-4-2, the pixel group 72-3-3, the pixel group 72-4-3, the pixel group 72-3-4 and the pixel group 72-4-4.

The readout order of each pixel 70 is set according to the following first to third conditions. The first condition is a condition that the readout orders of the pixels 70 adjacent to the boundaries of each two rows of the pixels 70 among the boundaries of the unit pixel regions 71 adjacent in the vertical direction are line-symmetric with respect to those boundaries.

The second condition is a condition that the readout order of each pixel 70 in two unit pixel regions 71 adjacent in the horizontal direction is line-symmetric with respect to the boundaries of the unit pixel regions 71. The third condition is a condition that the readout orders of the pixels 70 configuring each pixel group 72 are successive in the horizontal direction.

Herein, the boundaries of each two rows among the boundaries 73-1 to 73-7 of the unit pixel region 71-1 (71-3) and the unit pixel region 71-2 (71-4), which are adjacent in the vertical direction, are the boundary 73-1, the boundary 73-3, the boundary 73-5 and the boundary 73-7. Therefore, for example, the readout orders of the pixels 70 right above the boundary 73-1 and the readout orders of the pixels 70 right under the boundary 73-1 are set to 1, 2, 3, 4, 4, 3, 2, 1 in order from the left according to the first to third conditions.

That is, the readout orders of the pixels 70 right above the boundary 73-1 and the readout orders of the pixels 70 right under the boundary 73-1 are the same in order from the left and line-symmetric with respect to the boundary 73-1. Moreover, the readout order of each pixel 70 in the unit pixel region 71-1 (71-2) and the unit pixel region 71-3 (71-4), which are adjacent in the horizontal direction, is the same in order from the boundary 74 of the unit pixel region 71-1 (71-2) and the unit pixel region 71-3 (71-4) and line-symmetric with respect to the boundary 74. Furthermore, the readout orders of the pixels 70 disposed in the horizontal direction within the pixel group 72-1-1, the pixel group 72-3-1, the pixel group 72-2-1 and the pixel group 72-4-1 are successive.

As described above, the pixels 70, which configure the unit pixel regions 71 adjacent in the vertical direction and have the same readout order, face each other in the vertical direction with respect to the boundary 73-1, the boundary 73-3, the boundary 73-5 or the boundary 73-7 of each two rows. Therefore, by arranging the pixel drive wires 52 in the vicinity of the boundary 73-1, the boundary 73-3, the boundary 73-5 or the boundary 73-7, the pixel drive wires 52 can be shared among those pixels 70.

For example, the pixel drive wire 52 of the pixels 70, which configure the unit pixel region 71-1 and the unit pixel region 71-2 and the unit pixel region 71-3 and the unit pixel region 71-4, which are adjacent in the vertical direction, and have a readout order of 5, can be shared. As a result, in the CMOS image sensor 50, the pixel drive wires 52 are formed for each two rows by the number of pixels 70 (four in the example in FIG. 2) in the horizontal direction, which configure the unit pixel region 71.

Moreover, the readout orders of the adjacent pixels 70 through the boundary 73-1, the boundary 73-3, the boundary 73-5 and the boundary 73-7 and the boundary 74 are the same. Therefore, occurrence of image distortion at the boundaries of the unit pixel regions 71 can be prevented.

Note that, in FIG. 2, for convenience of illustration, only the pixel drive wire 52 of the pixels 70 with the readout order of 5 is shown, but the pixel drive wires 52 of the pixels 70 whose readout orders are other than 5 are also formed similarly. The same also applies to FIGS. 3, 4, 6 and 7 described later.

(Second Configuration Example of Pixel Region)

Figure 3:
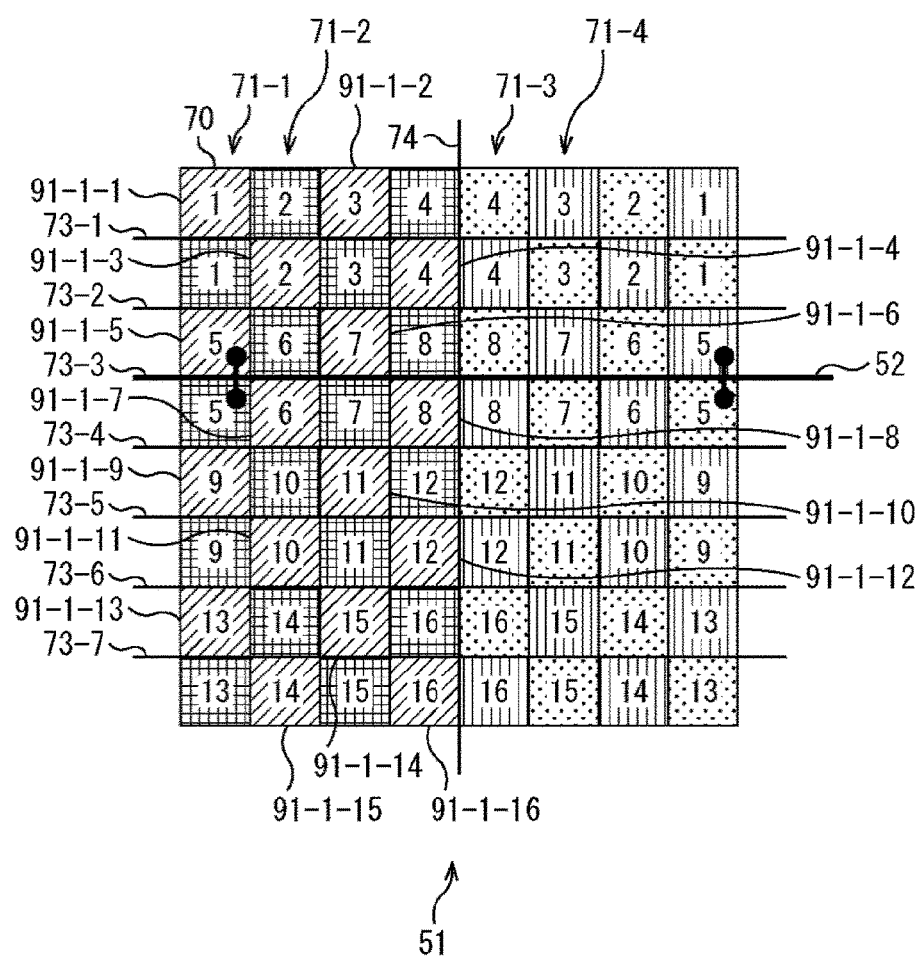
FIG. 3 is a diagram showing a second configuration example of the pixel region in FIG. 1.

FIG. 3 is a diagram showing a second configuration example of the pixel region 51 in FIG. 1.

Among the configurations shown in FIG. 3, the configurations having the same configurations as in FIG. 2 are given the same reference signs. Redundant descriptions will be omitted as appropriate.

The configuration of the pixel region 51 in FIG. 3 is the same as the configuration in FIG. 2 except that the pixel groups configuring the unit pixel regions 71 are 16 pixel groups constituted by 1×1 pixels 70 and except for the arrangement of the pixel groups.

Specifically, the unit pixel region 71-1 in FIG. 3 is configured by 16 pixel groups 91-1-1 to 91-1-16 constituted by 1×1 pixels 70. Similarly to the unit pixel region 71-1, the unit pixel regions 71-2 to 71-4 are also each configured by 16 pixel groups constituted by 1×1 pixels 70. Note that, in a case where it is not necessary to particularly distinguish the pixel groups of the unit pixel regions 71-1 to 71-4, they are collectively referred to as a pixel group 91 hereinafter.

Each pixel group 91 configuring the unit pixel regions 71 adjacent in the vertical direction is alternately arranged in the horizontal direction the vertical direction. That is, each pixel group 91 of two unit pixel regions 71 adjacent in the vertical direction is arranged checkerwise.

Specifically, each pixel group 91 of the unit pixel region 71-1 and each pixel group 91 of the unit pixel region 71-2, in which the unit pixel regions 71-1 and 71-2 are adjacent in the vertical direction, are alternately arranged in the horizontal direction and the vertical direction. Moreover, each pixel group 91 of the unit pixel region 71-3 and each pixel group 91 of the unit pixel region 71-4, in which the unit pixel regions 71-3 and 71-4 are adjacent in the vertical direction, are alternately arranged in the horizontal direction and the vertical direction.

Similarly to the pixel region 51 in FIG. 2, the readout order of each pixel 70 is also set according to the aforementioned first to third conditions in the pixel region 51 in FIG. 3. Thus, the readout order of each pixel 70 in the pixel region 51 in FIG. 3 is the same as the readout order of each pixel 70 in the pixel region 51 in FIG. 2.

Therefore, by arranging the pixel drive wire 52 in the vicinity of the boundary 73-1, the boundary 73-3, the boundary 73-5 or the boundary 73-7, the pixel drive wire 52, which controls the readout of the pixels 70, which configure the unit pixel regions 71 adjacent in the vertical direction and have the same readout orders, can be shared. As a result, in the CMOS image sensor 50, the pixel drive wires 52 are formed for each two rows by the number of pixels 70 (four in the example in FIG. 3) in the horizontal direction, which configure the unit pixel region 71.

Moreover, since the readout orders of the adjacent pixels 70 through the boundary 73-1, the boundary 73-3, the boundary 73-5, the boundary 73-7 and the boundary 74 are the same, occurrence of image distortion at the boundaries of the unit pixel region 71 can be prevented.

(Third Configuration Example of Pixel Region)

Figure 4:
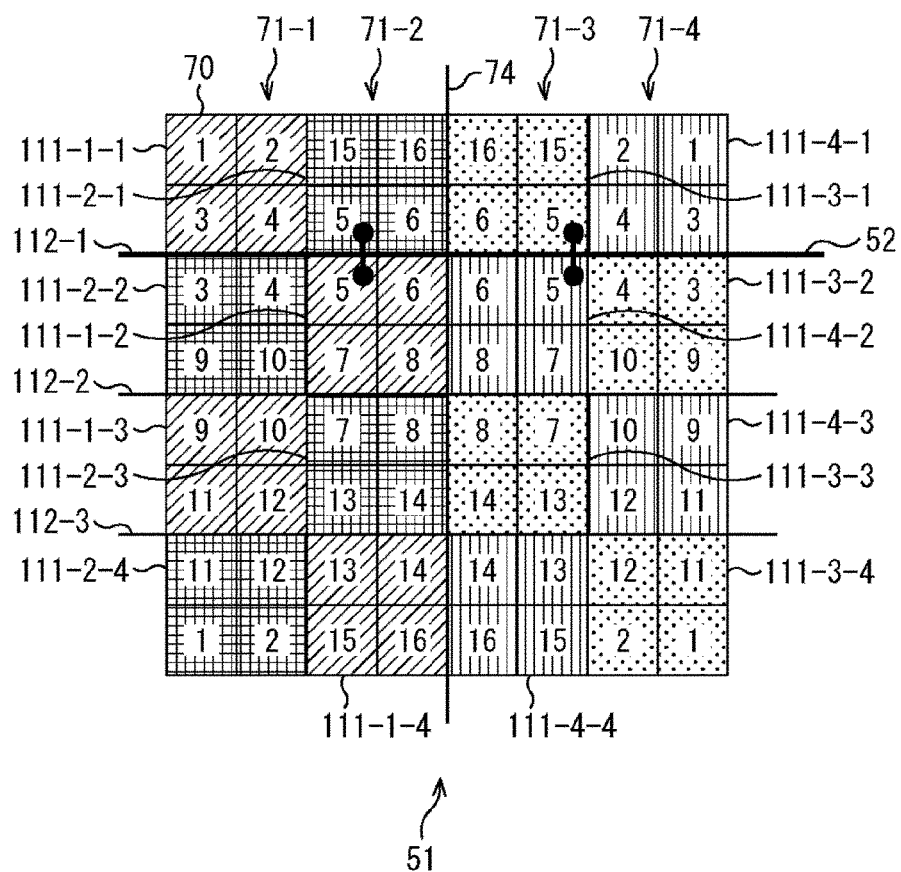
FIG. 4 is a diagram showing a third configuration example of the pixel region in FIG. 1.

FIG. 4 is a diagram showing a third configuration example of the pixel region 51 in FIG. 1.

Among the configurations shown in FIG. 4, the configurations having the same configurations as in FIG. 3 are given the same reference signs. Redundant descriptions will be omitted as appropriate.

The configuration of the pixel region 51 in FIG. 4 is the same as the configuration in FIG. 3 except that the pixel groups configuring the unit pixel regions 71 are four pixel groups constituted by 2×2 pixels 70.

Specifically, the unit pixel region 71-1 in FIG. 4 is configured by pixel groups 111-1-1 to 111-1-4 constituted by 2×2 pixels 70. Similarly to the unit pixel region 71-1, the unit pixel regions 71-2 to 71-4 are also configured by pixel groups 111-2-1 to 111-2-4, pixel groups 111-3-1 to 111-3-4 and pixel groups 111-4-1 to 111-4-4, respectively. Each pixel group is constituted by 2×2 pixels 70.

Note that, in a case where it is not necessary to particularly distinguish the pixel groups 111-1-1 to 111-1-4, the pixel groups 111-2-1 to 111-2-4, the pixel groups 111-3-1 to 111-3-4 and the pixel groups 111-4-1 to 111-4-4, they are collectively referred to as a pixel group 111 hereinafter.

Similarly to each pixel group 91 in FIG. 3, each pixel group 111 configuring the unit pixel regions 71 adjacent in the vertical direction is alternately arranged in the horizontal direction the vertical direction.

Moreover, similarly to the pixel region 51 in FIG. 3, the readout order of each pixel 70 is also set according to the aforementioned first to third conditions in the pixel region 51 in FIG. 4. Note that all boundaries 112-1 to 112-3 of the unit pixel regions 71 adjacent in the vertical direction exist by each two rows in the example in FIG. 4. Accordingly, the readout order of each pixel 70 adjacent to all the boundaries 112-1 to 112-3 is line-symmetric with respect to those boundaries 112-1 to 112-3.

Therefore, for example, the readout orders of the pixels 70 right above the boundary 112-1 and the readout orders of the pixels 70 right under the boundary 112-1 are set to 3, 6, 6, 5, 3 in order from the left.

That is, the readout orders of the pixels 70 right above the boundary 112-1 and the readout orders of the pixels 70 right under the boundary 112-1 are the same in order from the left and line-symmetric with respect to the boundary 112-1. Moreover, the readout order of each pixel 70 in the unit pixel region 71-2 (71-1) and the unit pixel region 71-3 (71-4), which are adjacent in the horizontal direction, is the same in order from the boundary 74 of the unit pixel region 71-2 (71-1) and the unit pixel region 71-3 (71-4) and line-symmetric with respect to the boundary 74.

Furthermore, the readout orders of the pixels 70 disposed in the horizontal direction within the pixel group 111-1-1, the pixel group 111-2-1, the pixel group 111-3-1, the pixel group 111-4-1, the pixel group 111-2-2, the pixel group 111-1-2, the pixel groups 111-4-2 and the pixel group 111-3-2 are successive.

As described above, the pixels 70, which configure the unit pixel regions 71 adjacent in the vertical direction and have the same readout order, face each other in the vertical direction with respect to the boundaries 112-1 to 112-3 of each two rows. Therefore, by arranging the pixel drive wires 52 in the vicinities of the boundaries 112-1 to 112-3, the pixel drive wires 52 can be shared among those pixels 70. As a result, in the CMOS image sensor 50, the pixel drive wires 52 are formed for each two rows by the number of pixels 70 (four in the example in FIG. 4) in the horizontal direction, which configure the unit pixel region 71.

Moreover, the readout orders of the adjacent pixels 70 through the boundaries 112-1 to 112-3 and the boundary 74 are the same. Therefore, occurrence of image distortion at the boundaries of the unit pixel regions 71 can be prevented.

(Fourth Configuration Example of Pixel Region)

Figure 5:
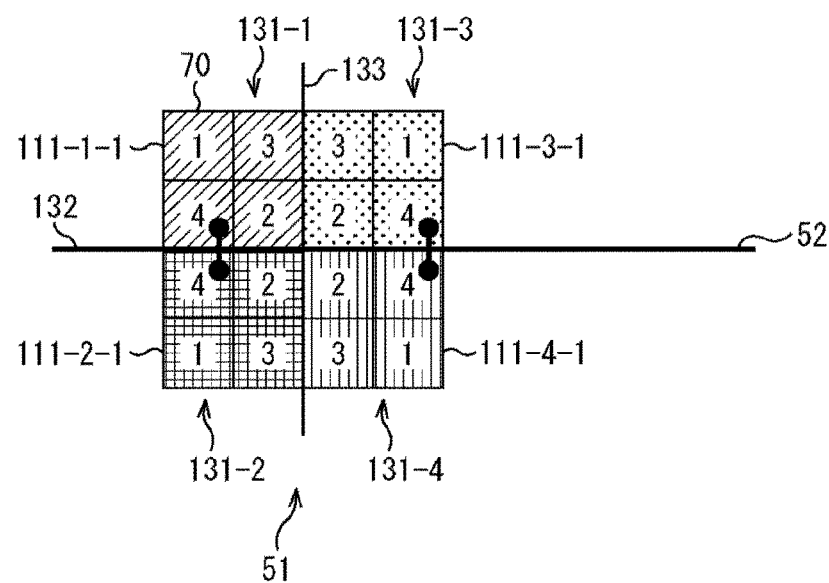
FIG. 5 is a diagram showing a fourth configuration example of the pixel region in FIG. 1.

FIG. 5 is a diagram showing a fourth configuration example of the pixel region 51 in FIG. 1.

Among the configurations shown in FIG. 5, the configurations having the same configurations as in FIG. 4 are given the same reference signs. Redundant descriptions will be omitted as appropriate.

The configuration of the pixel region 51 in FIG. 5 is the same as the configuration in FIG. 4 except that the unit pixel region 51A is configured by one pixel group 111 and except for the setting conditions of the readout order of each pixel 70.

Specifically, unit pixel regions 131-1 to 131-4, which are 2×2 unit pixel regions 51A, are arranged in the pixel region 51 in FIG. 5. The unit pixel region 131-1 is configured by one pixel group 111-1-1. That is, the unit pixel region 131-1 is configured by 2×2 pixels 70.

Similarly to the unit pixel region 131-1, the unit pixel regions 131-2 to 131-4 are also configured by one pixel group 111-2-1, one pixel group 111-3-1 and one pixel group 111-4-1, respectively. Note that, in a case where it is not necessary to particularly distinguish the unit pixel regions 131-1 to 131-4, they are collectively referred to as a unit pixel region 131 hereinafter.

The readout order of each pixel 70 is set according to the aforementioned first condition and second condition. Therefore, for example, the readout orders of the pixels 70 right above the boundary 132 of the unit pixel region 131-1 and the unit pixel region 131-2 adjacent in the vertical direction, and the readout orders of the pixels 70 right under the boundary 132 are set to 4, 2, 2, 4 in order from the left according to the first and second conditions.

That is, the readout orders of the pixels 70 right above a boundary 132 and the readout orders of the pixels 70 right under the boundary 132 are the same in order from the left and line-symmetric with respect to the boundary 132. Moreover, the readout order of each pixel 70 in the unit pixel region 131-1 (131-2) and the unit pixel region 131-3 (131-4), which are adjacent in the horizontal direction, is the same in order from a boundary 133 of the unit pixel region 131-1 (131-2) and the unit pixel region 131-3 (131-4) and line-symmetric with respect to the boundary 133.

As described above, the pixels 70, which configure the unit pixel regions 131 adjacent in the vertical direction and have the same readout order, face each other in the vertical direction with respect to the boundary 132. Therefore, by arranging the pixel drive wire 52 in the vicinity of the boundary 132, the pixel drive wire 52 can be shared among those pixels 70. As a result, in the CMOS image sensor 50, the pixel drive wires 52 are formed for each two rows by the number of pixels 70 (two in the example in FIG. 5) in the horizontal direction, which configure the unit pixel region 131.

Moreover, the readout orders of the adjacent pixels 70 through the boundary 132 and the boundary 133 are the same. Therefore, occurrence of image distortion at the boundaries of the unit pixel regions 131 can be prevented.

Note that, in FIG. 5, for convenience of illustration, only the pixel drive wire 52 of the pixel 70 with the readout order of 4 is shown, but the pixel drive wires 52 of the pixels 70 whose readout order is other than 4 are also formed similarly.

Furthermore, the setting conditions of the readout order of each pixel 70 in the pixel region 51 in FIG. 5 may include not only the first and second conditions but also the third condition.

(Fifth Configuration Example of Pixel Region)

Figure 6:
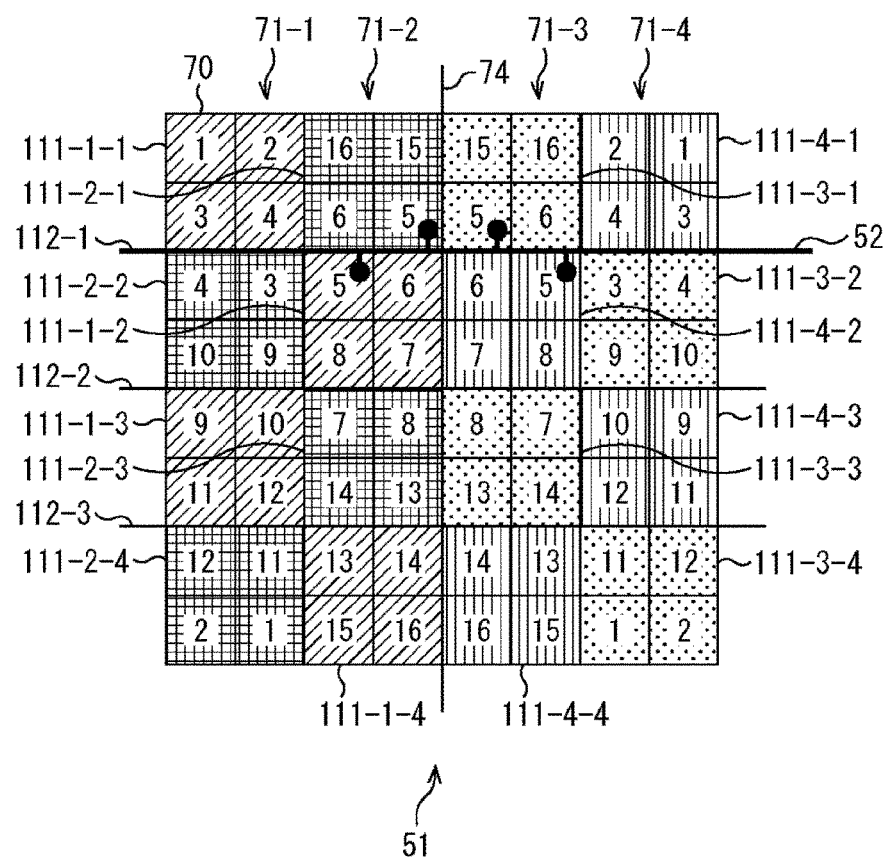
FIG. 6 is a diagram showing a fifth configuration example of the pixel region in FIG. 1.

FIG. 6 is a diagram showing a fifth configuration example of the pixel region 51 in FIG. 1.

Among the configurations shown in FIG. 6, the configurations having the same configurations as in FIG. 4 are given the same reference signs. Redundant descriptions will be omitted as appropriate.

The configuration of the pixel region 51 in FIG. 6 is the same as the configuration in FIG. 4 except for the setting conditions of the readout order of each pixel 70.

Specifically, in the pixel region 51 in FIG. 6, the readout order of each pixel 70 is set according to the aforementioned second and third conditions and an additional fourth condition. The fourth condition is that the readout orders of the adjacent pixels 70 across the boundaries 112-1 to 112-3 of each two rows of the pixels 70 among the boundaries of the unit pixel regions 71 adjacent in the vertical direction are non-line-symmetric with respect to those boundaries 112-1 to 112-3, but the same for each unit pixel region 71.

Therefore, for example, the readout orders of the pixels 70 right above the boundary 112-1 are set to 3, 4, 6, 5, 5, 6, 4, 3 in order from the left. On the other hand, the readout orders of the pixels 70 right under the boundary 112-1 are set to 4, 3, 5, 6, 6, 5, 3, 4 in order from the left.

That is, the readout orders of the pixels 70 right above the boundary 112-1 and the readout orders of the pixels 70 right under the boundary 112-1 are not the same in order from the left and are non-line-symmetric with respect to the boundary 112-1.

Moreover, the readout orders of two pixels 70 within the unit pixel region 71-1 (71-4) among the pixels 70 right above the boundary 112-1 and the readout orders of two pixels 70, which are adjacent to those pixels 70 across the boundary 112-1, within the unit pixel region 71-2 (71-3) are both 3 and 4.

Similarly, the readout orders of two pixels 70 within the unit pixel region 71-2 (71-3) among the pixels 70 right above the boundary 112-1 and the readout orders of two pixels 70, which are adjacent to those pixels 70 across the boundary 112-1, within the unit pixel region 71-1 (71-4) are both 5 and 6.

Moreover, the readout order of each pixel 70 in the unit pixel region 71-2 (71-1) and the unit pixel region 71-3 (71-4), which are adjacent in the horizontal direction, is the same in order from the boundary 74 of the unit pixel region 71-2 (71-1) and the unit pixel region 71-3 (71-4) and line-symmetric with respect to the boundary 74.

Furthermore, the readout orders of the pixels 70 disposed in the horizontal direction within the pixel group 111-1-1, the pixel group 111-1-2, the pixel group 111-2-1, the pixel group 111-2-2, the pixel group 111-3-1, the pixel group 111-3-2, the pixel group 111-4-1 and the pixel group 111-4-2 are successive.

As described above, the pixels 70, which configure the unit pixel regions 71 adjacent in the vertical direction and have the same readout order, are adjacent to the boundaries 112-1 to 112-3 of each the same two rows. Therefore, by arranging the pixel drive wires 52 in the vicinities of the boundaries 112-1 to 112-3, the pixel drive wires 52 can be shared among those pixels 70. As a result, in the CMOS image sensor 50, the pixel drive wires 52 are formed for each two rows by the number of pixels 70 (four in the example in FIG. 6) in the horizontal direction, which configure the unit pixel region 71.

(Sixth Configuration Example of Pixel Region)

Figure 7:
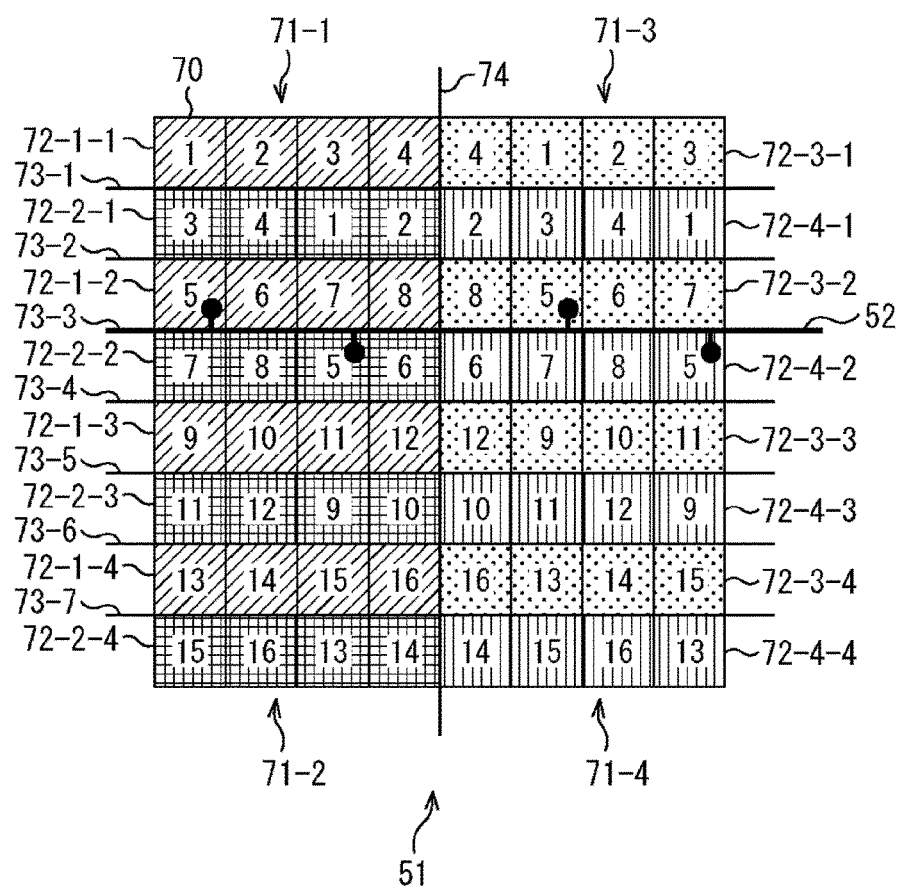
FIG. 7 is a diagram showing a sixth configuration example of the pixel region in FIG. 1.

FIG. 7 is a diagram showing a sixth configuration example of the pixel region 51 in FIG. 1.

Among the configurations shown in FIG. 7, the configurations having the same configurations as in FIG. 2 are given the same reference signs. Redundant descriptions will be omitted as appropriate.

The configuration of the pixel region 51 in FIG. 2 is the same as the configuration in FIG. 4 except for the setting conditions of the readout order of each pixel 70.

Specifically, in the pixel region 51 in FIG. 7, the readout order of each pixel 70 is set according to the aforementioned fourth condition and an additional fifth condition. The fifth condition is that the readout order of each pixel 70 in two unit pixel regions 71 adjacent in the horizontal direction is non-line-symmetric with respect to the boundary 74 of the unit pixel regions 71, but the readout orders of the adjacent pixels 70 across that boundary 74 are the same for each unit pixel region 71.

Therefore, for example, the readout orders of the pixels 70 right above the boundary 73-3 are set to 5, 6, 7, 8, 8, 5, 6, 7 in order from the left. On the other hand, the readout orders of the pixels 70 right under the boundary 73-3 are set to 7, 8, 5, 6, 6, 7, 8, 5 in order from the left.

That is, the readout orders of the pixels 70 right above the boundary 73-3 and the readout orders of the pixels 70 right under the boundary 73-3 are not the same in order from the left and are non-line-symmetric with respect to the boundary 73-1. Moreover, the readout orders of four pixels 70 within the unit pixel region 71-1 (71-3) among the pixels 70 right above the boundary 73-3 and the readout orders of four pixels 70 within the unit pixel region 71-2 (71-4) among the pixels 70 right under the boundary 73-3 are both 5 to 8.

Furthermore, the readout order of each pixel 70 in the unit pixel region 71-1 (71-2) and the unit pixel region 71-3 (71-4), which are adjacent in the horizontal direction, is not the same in order from the boundary 74 of the unit pixel region 71-1 (71-2) and the unit pixel region 71-3 (71-4) and is non-line-symmetric with respect to the boundary 74. The readout orders of four pixels 70 within the unit pixel region 71-1 (71-2) among the pixels 70 on the left of the boundary 74 and the readout orders of four pixels 70 within the unit pixel region 71-3 (71-4) among the pixels 70 on the right of the boundary 74 are both 5 to 8.

In addition, the readout orders of the pixels 70 disposed in the horizontal direction within the pixel group 72-1-2, the pixel group 72-2-2, the pixel group 72-3-2 and the pixel group 72-4-2 are not successive.

As described above, the pixels 70, which configure the unit pixel regions 71 adjacent in the vertical direction and have the same readout order, are adjacent to the boundaries 73-1, 73-3, 73-5 or 73-7 of each the same two rows. Therefore, by arranging the pixel drive wires 52 in the vicinity of the boundaries 73-1, 73-3, 73-5 or 73-7, the pixel drive wires 52 can be shared among those the pixels 70. As a result, in the CMOS image sensor 50, the pixel drive wires 52 are formed for each two rows by the number of pixels 70 (four in the example in FIG. 7) in the horizontal direction, which configure the unit pixel region 71.

(Description of Compensation by Signal Processing Unit)

Figure 8:
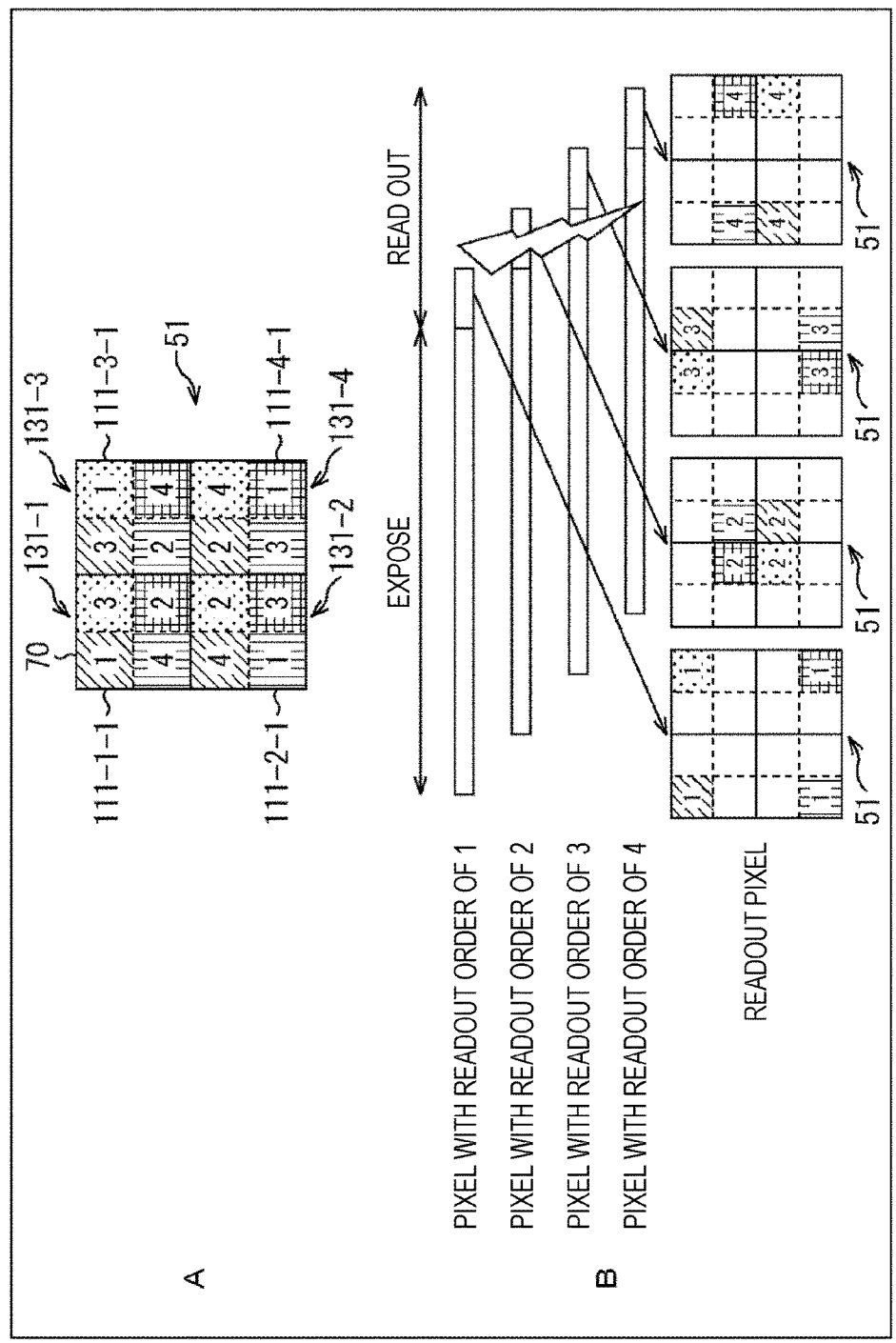
FIG. 8 is a diagram for illustrating an image generated by the signal processing unit in FIG. 1.
Figure 9:
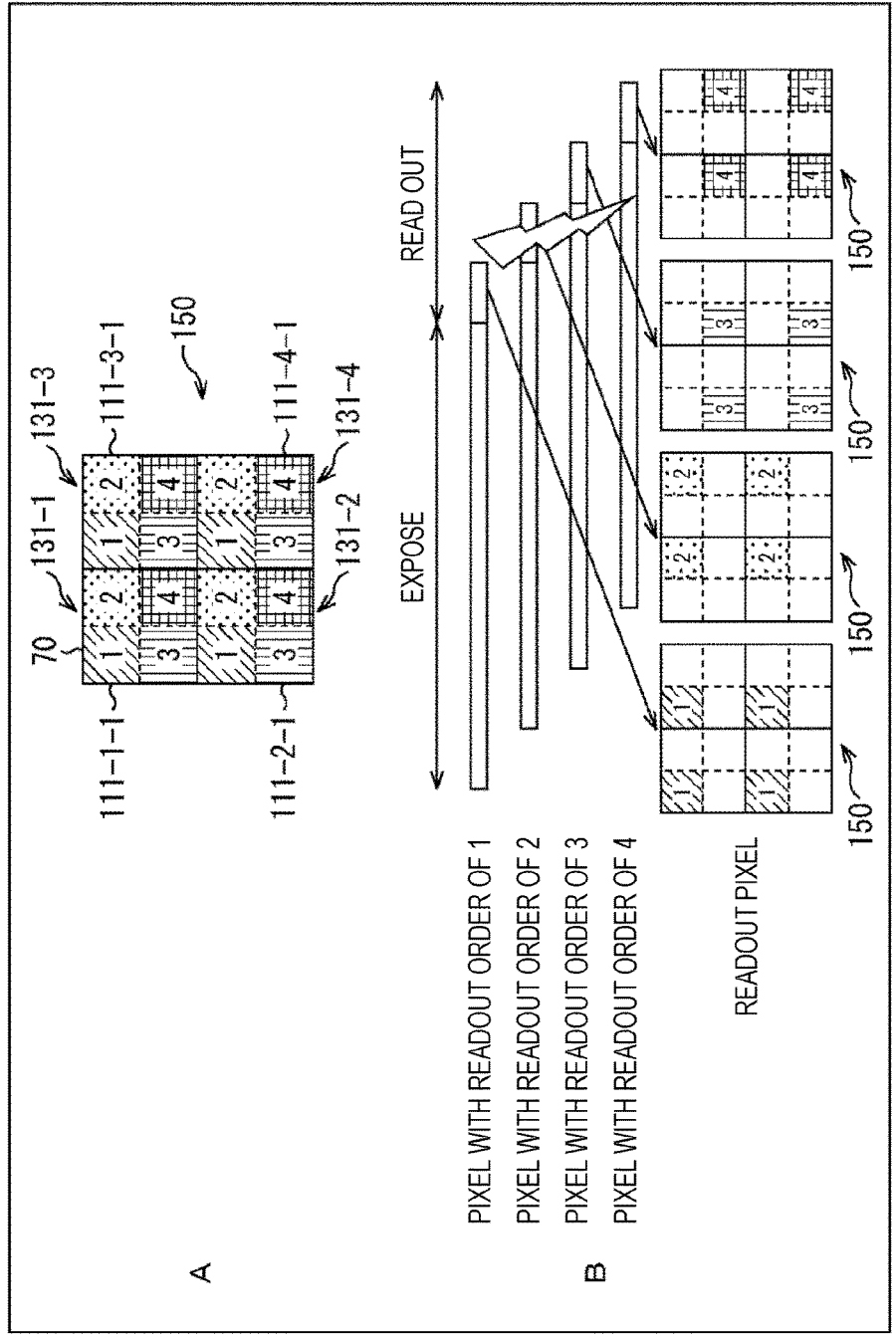
FIG. 9 is a diagram for illustrating an image in a case where colors of color filters of pixels having the same readout order are the same.
Figure 10:
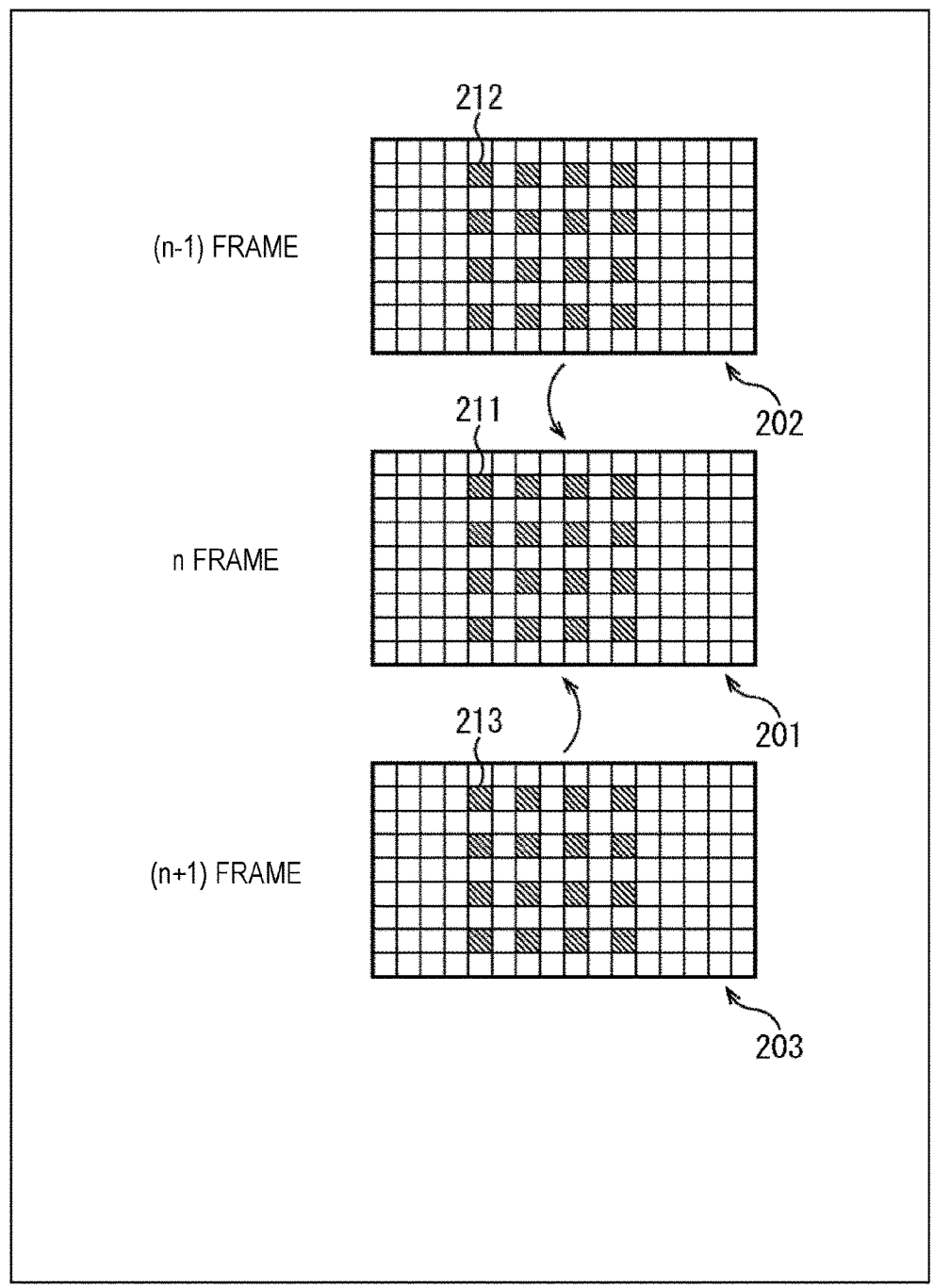
FIG. 10 is a diagram for illustrating a first compensation method.

FIGS. 8 to 10 are diagrams for illustrating compensation by the signal processing unit 62 in FIG. 1.

Note that, in FIGS. 8 to 10, a case where the configuration of the pixel region 51 is the configuration shown in FIG. 5 will be described, but the same applies to cases of the configurations shown in FIGS. 2 to 4, 6 and 7. In FIG. 8, ones which are the same as those in FIG. 5 are given the same reference signs.

Moreover, in FIG. 8, a square represents the pixel 70, and a number within the square represents the readout order set for the pixels 70. Furthermore, diagonal lines, polka dots, vertical stripes and grids given to the squares represent that colors of color filters of the pixels 70 represented by those squares are red (R), green (Gr), green (Gb) and blue (B), respectively.

As shown by A in FIG. 8, the color array of the color filters possessed by the pixels 70 arranged in the pixel region 51 is a Bayer array. Specifically, the colors of the color filters of the pixels 70 are R, Gr, Gb, B in order of upper left, upper right, lower left and lower right for each 2 (horizontal)×2 (vertical) pixels 70.

Accordingly, as shown by A in FIG. 8, the colors of the color filters of the pixels 70, which configure each of all the unit pixel regions 131 within the pixel region 51 and have the same readout order, include all of R, Gr, Gb and B which can be assigned as the colors of the color filters of the pixels 70.

Therefore, as shown by B in FIG. 8, for example, in a case where the pixels 70 are irradiated with white light by flash or the like during readout of the pixel signals of the pixels 70 whose readout order is 2, pixel signals of all the colors of that white light can be acquired in the pixels 70 whose readout order is 3 and after.

By performing interpolation on the basis of the pixel signals of R, Gr, Gb, or B of each pixel 70 acquired in this way, the signal processing unit 62 generates, as an image, the pixel signals of R, Gr, Gb, and B of all the pixels 70. Therefore, the image includes white color of the white light, and a color artifact does not occur.

On the other hand, as shown by A in FIG. 9, in a case where a pixel region 150, in which the colors of the color filters of the pixels 70 having the same readout order within each unit pixel region 131 are the same, is provided instead of the pixel region 51, a color artifact occurs when the pixels 70 are irradiated with white light by flash or the like during readout of the pixels 70 whose readout order is 2.

That is, as shown by B in FIG. 9, when the pixels 70 are irradiated with white light by flash or the like during readout of the pixel signals of the pixels 70 whose readout order is 2, only the pixel signals of Gb and B out of the white light are acquired in the pixels 70 whose readout order is 3 or after. As a result, the image generated by the signal processing unit 62 includes only Gb and B out of white color corresponding to the white light. Therefore, a color artifact occurs.

As described above, in the pixel region 51, in a case where the pixels 70 are irradiated with white light by flash or the like during readout of the pixel signals of all the pixels 70, the image includes white color corresponding to the white light, and a color artifact does not occur. However, due to the white color corresponding to white light, there is a possibility that a pixel signal equal to or greater than a predetermined threshold value can be generated in a pattern.

Therefore, in a case where the ratio of the pixels 70 whose pixel signals for all the pixels 70 in a predetermined region within the pixel region 51 are equal to or greater than a predetermined threshold value is equal to or greater than a threshold value, the signal processing unit 62 determines that the pixel signals equal to or greater than the predetermined threshold value are generated in a pattern by the flash light. Then, the signal processing unit 62 uses the pixel signals stored in the memory unit 63 to compensate the pixel signals equal to or greater than the predetermined threshold value. As a compensation method, for example, there are the following first method and second method.

As shown in FIG. 10, the first method is a method of compensating a pixel signal equal to or greater than a predetermined threshold value by using a pixel signal less than the predetermined threshold value, which is at least one of timewise before and after the pixel signal which is equal to or greater than the predetermined threshold and of the pixels 70 whose pixel signals are equal to or greater than the predetermined threshold value. In the first method, for example, pixel signals 211, which are equal to or greater than the predetermined threshold value and of an image 201 of the n-th frame, are compensated by using pixel signals 212, which are less than the predetermined threshold value within an image 202 of n−1-th frame, and pixel signals 213, which are less than the predetermined threshold value within an image 203 of n+1-th frame, the pixel signals 212 and 213 being of the pixels 70 corresponding those pixel signals 211. Note that each square represents a pixel signal of each pixel 70 in FIG. 10. The same also applies to FIG. 11 described later.

The compensation by the first method can be performed in a case where the image captured by the CMOS image sensor 50 is a moving image. In the compensation by the first method, the resolution after the compensation can be set to the same resolution as the resolution before the compensation.

Figure 11:
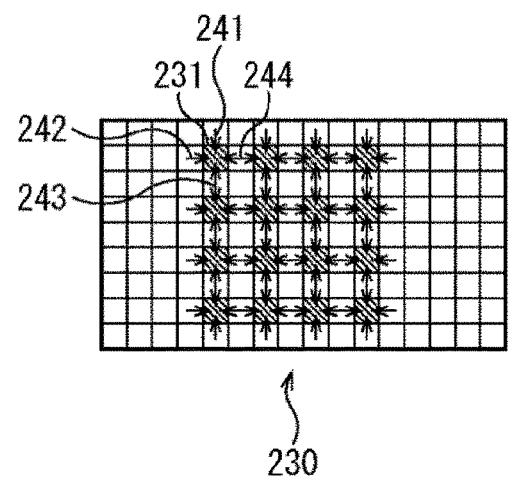
FIG. 11 is a diagram for illustrating a second compensation method.

As shown in FIG. 11, the second method is a method of compensating pixel signals equal to or greater than a predetermined threshold value by using pixel signals less than the predetermined threshold value, which are of the pixels 70 around the pixels 70 corresponding to the pixel signals equal to or greater than the predetermined threshold value. That is, in the second method, pixel signals 231 equal to or greater than the predetermined threshold value within an image 230 are compensated by using pixel signals (in the example in FIG. 11, pixel signals 241 to 244 of the pixels 70 on the top, bottom, left and right) which are less than the predetermined threshold value and of the pixels 70 around pixels 70 corresponding to those pixel signals 231.

The compensation by the second method can be performed whether the image captured by the CMOS image sensor 50 is a moving image or a still image. In the compensation by the second method, the resolution after the compensation is lower than the resolution before the compensation.

As described above, in the CMOS image sensor 50, the pixel drive wires 52 of the pixels 70, which configure the unit pixel regions 71 (131) adjacent in the vertical direction and have the same readout order, are shared. Therefore, the number of the pixel drive wires 52 can be reduced as compared with a case where the pixel drive wires 52 are formed for each pixel 70. For example, in a case where the unit pixel region 71 (131) is configured by horizontal (H)×vertical (V) pixels, the number of pixel drive wires 52 required for one unit pixel region 71 (131) is H×V/2, and the number of the pixel drive wires 52 per row of the pixels 70 is H/2.

(Arrangement Example of Each Part of CMOS Image Sensor)

Figure 12:
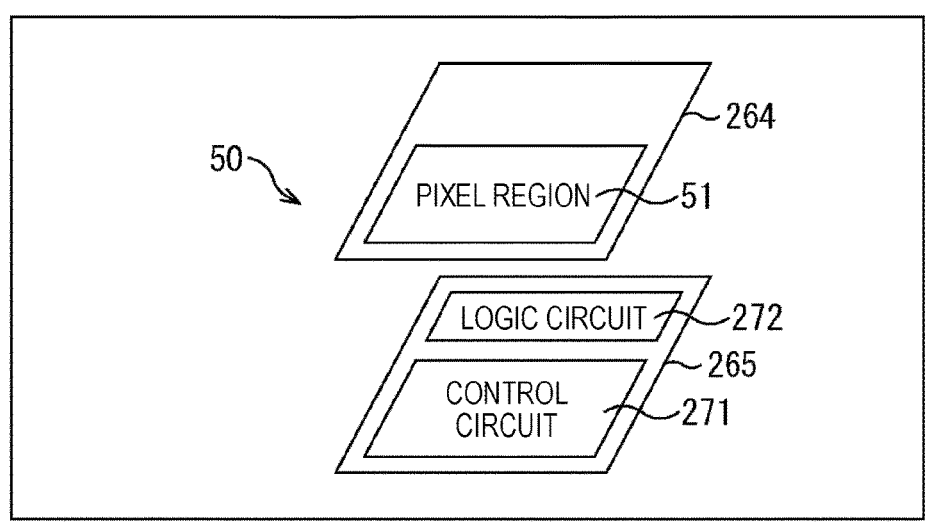
FIG. 12 is a diagram showing an arrangement example of each part of the CMOS image sensor in FIG. 1.

FIG. 12 is a diagram showing an arrangement example of each part of the CMOS image sensor 50 in FIG. 1.

As shown in FIG. 12, the CMOS image sensor 50 is formed by laminating a semiconductor substrate 264 (a first chip) and a semiconductor substrate 265 (a second chip). The pixel region 51 is formed in the semiconductor substrate 264, and a control circuit 271 and a logic circuit 272 are formed in the semiconductor substrate 265. The semiconductor substrate 264 and the semiconductor substrate 265 are connected to each unit pixel region 71 (131).

The control circuit 271 is a circuit constituted by the pixel drive unit 54, the readout region 55, the readout drive wires 56, the vertical signal wires 57, the readout circuit drive unit 58, the column processing unit 59, the horizontal drive unit 60 and the system control unit 61, and the logic circuit 272 is a circuit constituted by the signal processing unit 62 and the memory unit 63.

Note that the control circuit 271 and the logic circuit 272 are formed in the same semiconductor substrate 265 in the example in FIG. 12, but they may be formed in different semiconductor substrates.

Second Embodiment (Configuration Example of One Embodiment of Imagine Device)

Figure 13:
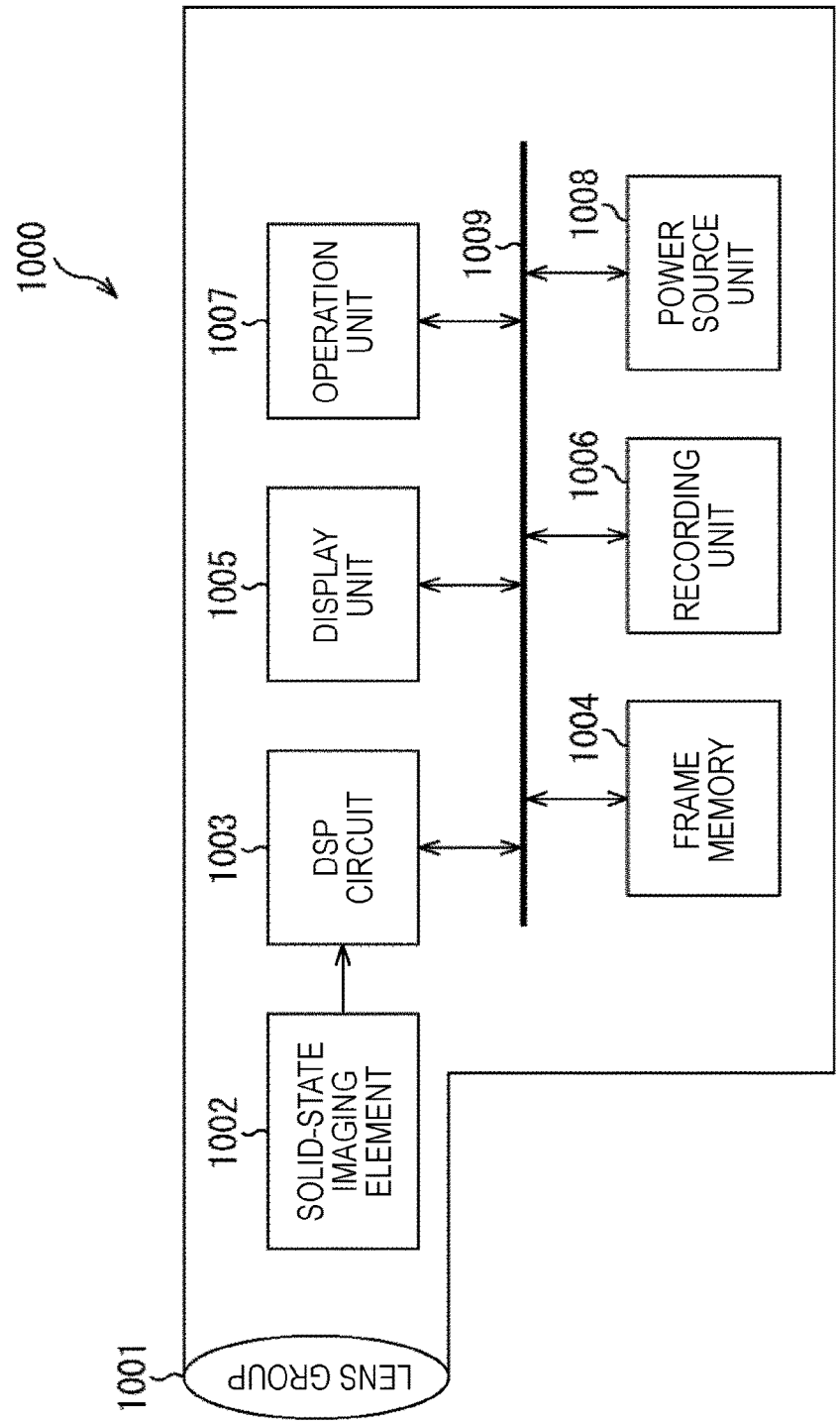
FIG. 13 is a block diagram showing a configuration example of an imaging device as an electronic apparatus to which the present disclosure is applied.
Figure 14:
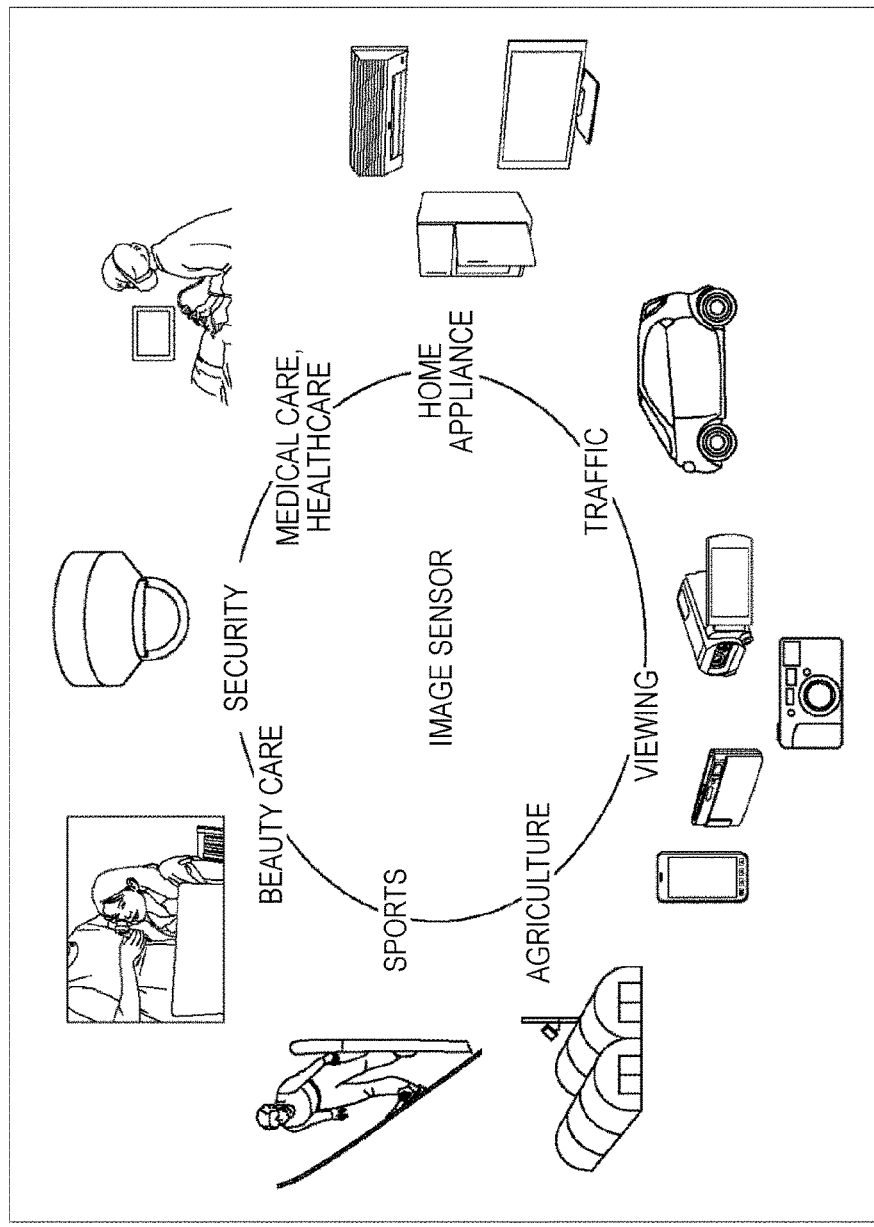
FIG. 14 is a diagram showing a usage example of using the CMOS image sensor.

FIG. 13 is a block diagram showing a configuration example of one embodiment of an imaging device as an electronic apparatus to which the present disclosure is applied.

An imaging device 1000 in FIG. 13 is a video camera, a digital still camera or the like. The imaging device 1000 is constituted by a lens group 1001, a solid-state imaging element 1002, a DSP circuit 1003, a frame memory 1004, a display unit 1005, a recording unit 1006, an operation unit 1007 and a power source unit 1008. The DSP circuit 1003, the frame memory 1004, the display unit 1005, the recording unit 1006, the operation unit 1007 and the power source unit 1008 are connected to each other via a bus line 1009.

The lens group 1001 takes in incident light (image light) from a subject and forms an image on an imaging surface of the solid-state imaging element 1002. The solid-state imaging element 1002 is constituted by the aforementioned CMOS image sensor 50. The solid-state imaging element 1002 converts the light amount of the incident light imaged on the imaging surface by the lens group 1001 into electric signals in the unit of pixel and supplies the electric signals as pixel signals to the DSP circuit 1003.

The DSP circuit 1003 performs predetermined image processing on the pixel signals supplied from the solid-state imaging element 1002, supplies image signals after the image processing to the frame memory 1004 in the unit of frame and causes the frame memory 1004 to temporarily store the image signals.

The display unit 1005 is constituted by, for example, a panel type display device such as a liquid crystal panel or an organic electro luminescence (EL) panel and displays an image on the basis of the pixel signals in the unit of frame temporarily stored in the frame memory 1004.

The recording unit 1006 is constituted by a digital versatile disk (DVD), a flash memory or the like and reads out and records the pixel signals in the unit of frame temporarily stored in the frame memory 1004.

The operation unit 1007 issues an operation command for various functions possessed by the imaging device 1000 under the operation by a user. The power source unit 1008 appropriately supplies power to the DSP circuit 1003, the frame memory 1004, the display unit 1005, the recording unit 1006 and the operation unit 1007.

The electronic apparatus to which the present technology is applied may be any device which uses the CMOS image sensor 50 for the image taking-in unit (photoelectric conversion unit), and is a portable terminal device having an imaging function, a copier using the CMOS image sensor 50 for an image reading unit, or the like, besides the imaging device 1000.

<Usage Example of CMOS Image Sensor>

FIG. 14 is a diagram showing a usage example of using the aforementioned CMOS image sensor 50.

The aforementioned CMOS image sensor 50 can be used in, for example, various cases for sensing light such as visible light, infrared light, ultraviolet light and X-rays as described below.

A device, such as a digital camera or a portable apparatus with a camera function, which shoots an image to be used for viewing.

A device used for traffic, such as an in-vehicle sensor which shoots the front, rear, surroundings, inside and the like of an automobile for safe driving such as automatic stop, recognition of driver's condition, and the like, a surveillance camera which monitors traveling vehicles and roads, or a distance measuring sensor which measures the distance between the vehicles, and the like.

A device used for home appliances such as a TV, a refrigerator and an air conditioner for shooting user's gesture to perform apparatus operation according to that gesture.

A device used for medical care and healthcare, such as an endoscope or a device for performing angiography by receiving infrared light.

A device used for security, such as a surveillance camera used for crime prevention or a camera for personal authentication use.

A device used for beauty care, such as a skin measuring instrument which shoots skin or a microscope which shoots a scalp.

A device used for sports, such as an action camera or a wearable camera for sports applications and the like.

A device used for agriculture, such as a camera for monitoring the conditions of fields and crops.

Note that the effects described in this description are merely examples and are not limited, and other effects may be provided.

Moreover, the embodiments of the present disclosure are not limited to the aforementioned embodiments, and various modifications can be made in a scope without departing from the gist of the present disclosure.

For example, the number of pixel groups configuring the unit pixel regions 51A can be any number as long as the number is one or more. Moreover, the number of pixels configuring the pixel group can be any number as long as the number is one or more. Furthermore, the number of the unit pixel region 51A configuring the pixel region 51 can be any number as long as the number is two or more.

Note that the present disclosure may also have the following configurations.

(1)
A solid-state imaging element, including:

unit pixel regions which are arranged in an array and configured by a plurality of pixels; and a readout circuit which is provided for each of the unit pixel regions and reads out, in a predetermined order, pixel signals of the plurality of pixels configuring the unit pixel regions, in which wires, which control readout of the pixels which configure the unit pixel regions adjacent in a predetermined direction and have the same readout order, are configured to be shared.

(2)
The solid-state imaging element according to (1), in which the plurality of pixels are configured to be one or more pixel groups configured by one row or two rows of the pixels.

(3)
The solid-state imaging element according to (2), in which, in a case where the plurality of pixels are a plurality of the pixel groups, each of the pixel groups configuring the unit pixel regions adjacent in the predetermined direction is configured to be arranged alternately.

(4)
The solid-state imaging element according to any one of (1) to (3), in which the readout order of the pixels adjacent to boundaries of each two rows of the pixels among boundaries of the unit pixel regions adjacent in the predetermined direction is configured to be the same for each of the unit pixel regions.

(5)
The solid-state imaging element according to (4), in which the readout order of the pixels adjacent to the boundaries of each two rows of the pixels among the boundaries of the unit pixel regions adjacent in the predetermined direction is configured to be line-symmetric with respect to the boundaries.

(6)
The solid-state imaging element according to any one of (1) to (5), in which colors of color filters possessed by the pixels with the same readout order within all the unit pixel regions include all colors which can be assigned as the colors of the color filters.

(7)
The solid-state imaging element according to (6), further including a compensation unit which compensates the pixel signals in a case where the pixel signals are equal to or greater than a predetermined threshold value.

(8)
The solid-state imaging element according to (7), in which the compensation unit is configured to compensate the pixel signals equal to or greater than the predetermined threshold value in a case where a ratio of the pixels whose pixel signals for all the pixels within a predetermined region are equal to or greater than the predetermined threshold value is equal to or greater than a threshold value.

(9)
The solid-state imaging element according to (8), in which the compensation unit is configured to compensate the pixel signals equal to or greater than the predetermined threshold value by using at least one of the pixel signals timewise before and after the pixel signals of the pixels corresponding to the pixel signals equal to or greater than the predetermined threshold value.

(10)
The solid-state imaging element according to (8) in which the compensation unit is configured to compensate the pixel signals equal to or greater than the predetermined threshold by using the pixel signals of the pixels around the pixels corresponding to the pixel signals equal to or greater than the predetermined threshold value.

(11)
The solid-state imaging element according to any one of (1) to (10), in which the unit pixel regions are formed in a first chip, the readout circuit is formed in a second chip, and the first chip and the second chip are configured to be connected to each of the unit pixel regions.

(12) An electronic apparatus, including a solid-state imaging element including:

unit pixel regions which are arranged in an array and configured by a plurality of pixels; and a readout circuit which is provided for each of the unit pixel regions and reads out, in a predetermined order, pixel signals of the plurality of pixels configuring the unit pixel regions, in which wires, which control readout of the pixels which configure the unit pixel regions adjacent in a predetermined direction and have the same readout order, are configured to be shared.

REFERENCE SIGNS LIST

50 CMOS image sensor
52 Pixel drive wire
55A Readout circuit
62 Signal processing unit
70 Pixel
71-1 to 71-4 Unit pixel region
72-1-1 to 72-1-4, 72-2-1 to 72-2-4, 72-3-1 to 72-3-4, 72-4-1 to 72-4-4 Pixel group
73-1 to 73-7 Boundary
91-1-1 to 91-1-16 Pixel group
111-1-1 to 111-1-4, 111-2-1 to 111-2-4, 111-3-1 to 111-3-4, 111-4-1 to 111-4-4 Pixel group
131-1 to 131-4 Unit pixel region
211 to 213 Pixel signal
231, 241 to 244 Pixel signal
264, 265 Semiconductor substrate
1000 Imaging device
1002 Solid-state imaging element

What is claimed is:

1. A solid-state imaging element, comprising:
   unit pixel regions which are arranged in an array and configured by a plurality of pixels;
   a readout circuit which is provided for each of the unit pixel regions and reads out, in a predetermined order, pixel signals of the plurality of the pixels configuring the unit pixel regions; and
   a compensation unit which compensates the pixel signals in a case where the pixel signals are equal to or greater than a predetermined threshold value,
   wherein wires, which control readout of the pixels which configure the unit pixel regions adjacent in a predetermined direction and have a same readout order, are configured to be shared, wherein colors of color filters possessed by the pixels with the same readout order within all the unit pixel regions include all colors which can be assigned as the colors of the color filters, and
   wherein the compensation unit is configured to compensate the pixel signals equal to or greater than the predetermined threshold value in a case where a ratio of the pixels whose pixel signals for all the pixels within a predetermined region are equal to or greater than the predetermined threshold value is equal to or greater than a threshold value.

2. The solid-state imaging element according to claim 1, wherein the plurality of the pixels are configured to be one or more pixel groups configured by one row or two rows of the pixels.

3. The solid-state imaging element according to claim 2, wherein, in a case where the plurality of the pixels are a plurality of the pixel groups, the pixel groups adjacent in the predetermined direction are configured to be arranged alternately.

4. The solid-state imaging element according to claim 1, wherein the readout order of the pixels adjacent to boundaries of each two rows of the pixels among boundaries of the unit pixel regions adjacent in the predetermined direction is configured to be same for each of the unit pixel regions.

5. The solid-state imaging element according to claim 4, wherein the readout order of the pixels adjacent to the boundaries of each two rows of the pixels among the boundaries of the unit pixel regions adjacent in the predetermined direction is configured to be line-symmetric with respect to the boundaries.

6. The solid-state imaging element according to claim 1, wherein the compensation unit is configured to compensate the pixel signals equal to or greater than the predetermined threshold value by using at least one of the pixel signals timewise before and after the pixel signals of the pixels corresponding to the pixel signals equal to or greater than the predetermined threshold value.

7. The solid-state imaging element according to claim 1, wherein the compensation unit is configured to compensate the pixel signals equal to or greater than the predetermined threshold by using the pixel signals of the pixels around the pixels corresponding to the pixel signals equal to or greater than the predetermined threshold value.

8. The solid-state imaging element according to claim 1, wherein the unit pixel regions are formed in a first chip, the readout circuit is formed in a second chip, and the first chip and the second chip are configured to be connected to each of the unit pixel regions.

9. An electronic apparatus, comprising a solid-state imaging element including:
   unit pixel regions which are arranged in an array and configured by a plurality of pixels;
   a readout circuit which is provided for each of the unit pixel regions and reads out, in a predetermined order, pixel signals of the plurality of the pixels configuring the unit pixel regions; and
   a compensation unit which compensates the pixel signals in a case where the pixel signals are equal to or greater than a predetermined threshold value,
   wherein wires, which control readout of the pixels which configure the unit pixel regions adjacent in a predetermined direction and have a same readout order, are configured to be shared, wherein colors of color filters possessed by the pixels with the same readout order within all the unit pixel regions include all colors which can be assigned as the colors of the color filters, and
   wherein the compensation unit is configured to compensate the pixel signals equal to or greater than the predetermined threshold value in a case where a ratio of the pixels whose pixel signals for all the pixels within a predetermined region are equal to or greater than the predetermined threshold value is equal to or greater than a threshold value.

10. The electronic apparatus according to claim 9, wherein the plurality of the pixels are configured to be one or more pixel groups configured by one row or two rows of the pixels.

11. The electronic apparatus according to claim 10, wherein the pixel groups alternate in the predetermined direction.

12. The electronic apparatus according to claim 9, wherein the readout order of the pixels adjacent to boundaries of each two rows of the pixels among boundaries of the unit pixel regions adjacent in the predetermined direction is configured to be same for each of the unit pixel regions.

13. The electronic apparatus according to claim 12, wherein the readout order of the pixels adjacent to the boundaries of each two rows of the pixels among the boundaries of the unit pixel regions adjacent in the predetermined direction is configured to be line-symmetric with respect to the boundaries.

14. The electronic apparatus according to claim 9, wherein the compensation unit is configured to compensate the pixel signals equal to or greater than the predetermined threshold value by using at least one of the pixel signals timewise before and after the pixel signals of the pixels corresponding to the pixel signals equal to or greater than the predetermined threshold value.

15. The electronic apparatus according to claim 9, wherein the compensation unit is configured to compensate the pixel signals equal to or greater than the predetermined threshold by using the pixel signals of the pixels around the pixels corresponding to the pixel signals equal to or greater than the predetermined threshold value.

16. The electronic apparatus according to claim 9,
wherein the unit pixel regions are formed in a first chip,
the readout circuit is formed in a second chip, and
the first chip and the second chip are configured to be connected to each of the unit pixel regions.

\* \* \* \* \*